(12) United States Patent
Aoki

(10) Patent No.: US 8,179,681 B2
(45) Date of Patent: May 15, 2012

(54) MODULE STRUCTURE

(75) Inventor: Fumio Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/607,306

(22) Filed: Oct. 28, 2009

(65) Prior Publication Data

US 2010/0118497 A1   May 13, 2010

(30) Foreign Application Priority Data

Nov. 10, 2008 (JP) ................................. 2008-288003

(51) Int. Cl.
*H05K 1/14* (2006.01)
(52) U.S. Cl. .................. 361/741; 361/807; 361/810
(58) Field of Classification Search .................. 361/807, 361/810, 741, 818, 816
See application file for complete search history.

(56) References Cited

U.S. PATENT DOCUMENTS

| | | | | |
|---|---|---|---|---|
| 3,116,959 | A * | 1/1964 | Abodeely | 439/378 |
| 5,395,099 | A * | 3/1995 | Hall | 269/47 |
| 5,690,504 | A * | 11/1997 | Scanlan et al. | 439/378 |
| 6,317,328 | B1 * | 11/2001 | Su | 361/704 |
| 7,170,557 | B2 * | 1/2007 | Manico et al. | 348/333.07 |
| 7,466,562 | B2 * | 12/2008 | Gilliland et al. | 361/803 |
| 7,667,982 | B2 * | 2/2010 | Hamasaki et al. | 361/803 |
| 2008/0036021 | A1 | 2/2008 | Miyoshi et al. | |

FOREIGN PATENT DOCUMENTS

| | | |
|---|---|---|
| JP | 5-55609 | 3/1993 |
| JP | 2006-91706 | 4/2006 |

* cited by examiner

*Primary Examiner* — Hung S Bui

(74) *Attorney, Agent, or Firm* — Staas & Halsey LLP

(57) ABSTRACT

An apparatus includes a case including a surface, a bottom face and a first hole arranged on the bottom face; a first connector on the bottom face of the case; and a guide pin arranged in the first hole and being capable of moving in the first hole.

8 Claims, 12 Drawing Sheets

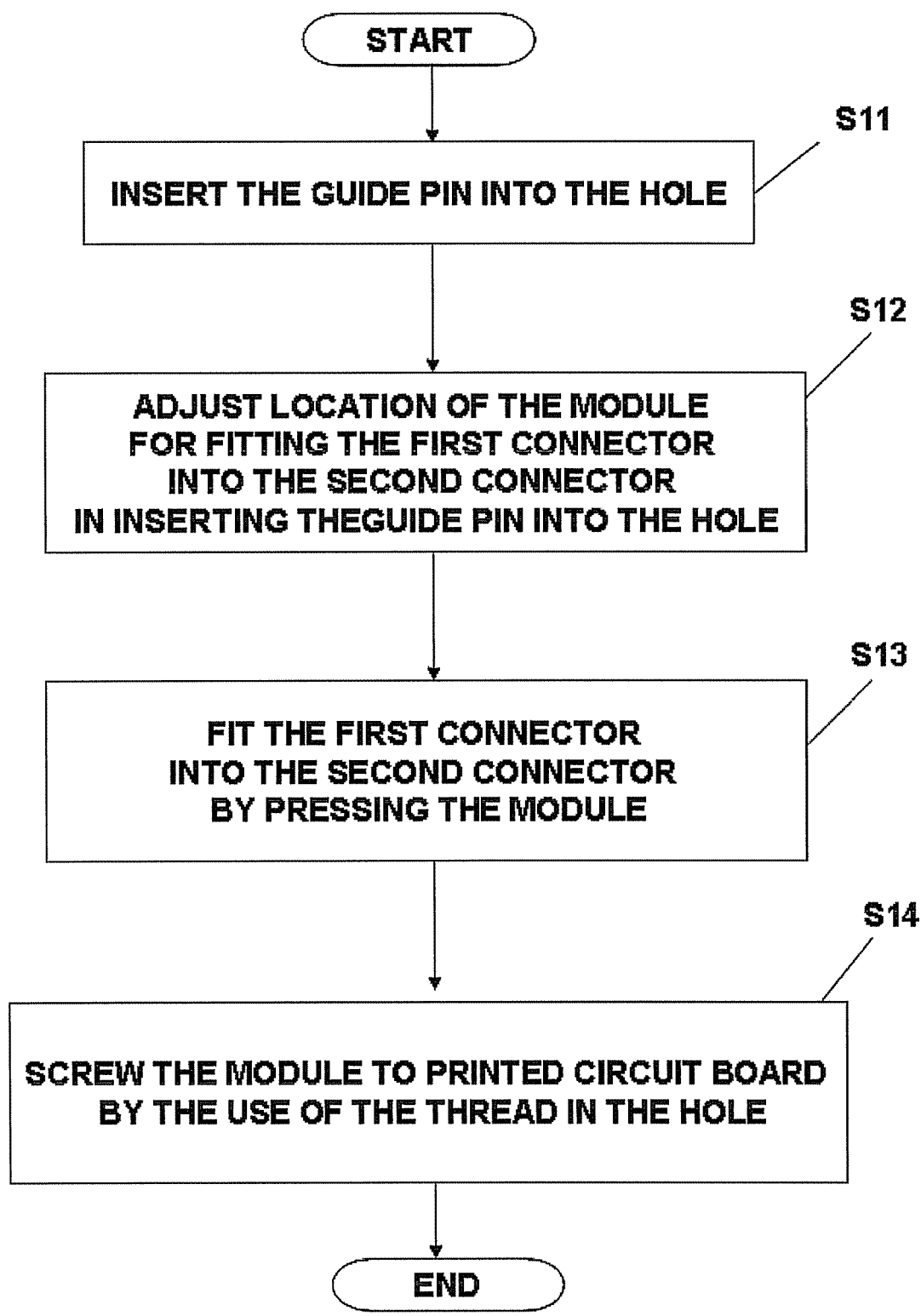

MODULE STRUCTURE

CROSS-REFERENCE TO RELATED APPLICATION

This application is based upon and claims the benefit of priority of the prior Japanese Patent Application No. 2008-288003, filed on Nov. 10, 2008, the entire contents of which are incorporated herein by reference.

FIELD

The embodiments discussed herein are related to a module structure.

BACKGROUND

In various electric apparatuses, a module is mounted on a printed circuit board and the printed circuit board on which the module is mounted being stored to constitute an electronic apparatus.

As a module mounting structure in which a module is mounted on a printed circuit board, a mounting structure capable of electrically connecting the module with the printed circuit board and mechanically fixing and holding the module to the printed circuit board has been employed.

Currently, a mounting structure is mainly employed in which a surface mount device (SMD) connector is preliminarily mounted on a surface of a printed circuit board and a module is mounted on the printed circuit board so that a connector at the module side is fitted with the SMD connector. In the mounting structure, the connector at the module side is fitted with the SMD connector by pressing the module to the printed circuit board, and a screw fixing is performed from the surface of the printed circuit board opposite to the surface on which the module is mounted.

FIG. 1 is a diagram illustrating a module mounting structure in which a module is mounted on a printed circuit board by using a conventional SMD connector. FIG. 1A is a perspective view illustrating the module and the module mounting structure, and FIG. 1B is a front view illustrating the module and the module mounting structure. As illustrated in FIG. 1A and FIG. 1B, in the conventional module mounting structure, a module 110 on which a connector 112 is mounted on a bottom surface 118 of a housing 111 is mounted on a printed circuit board 130 on which a connector 131 is provided on an upper surface. The mounted module 110 is screw clamped by a screw 134 to a screw hole 119 provided at the bottom surface 118 of the housing 111 via a through hole 132 provided on the printed circuit board 130.

When the connector 112 at the module side is fitted with the connector 131 at the printed circuit board side, the module 110 is pressed to the printed circuit board 130 side. At this time, when the module 110 is pressed to the printed circuit board 130 in the state where the positions of the connectors 112, 131 are deviated to each other, there is a case that pins of the connectors 112, 131 are bent or the pins are broken.

Accordingly, a module mounting structure capable of preventing positional deviation of a module on a printed circuit board when the module is mounted on the printed circuit board is desired.

As a method for preventing positional deviation when a module is mounted on a printed circuit board, there is a structure in which a concave is provided on a lower surface of the module when a module is attached to a printed circuit board in order not to generate deflection between with the printed circuit board even when a warpage is generated on a base table of the module (as an example, see Japanese Laid-open Patent Publication No. 05-55609).

Further, for example, there is also a structure that prevents positional deviation between an upper small substrate and a lower large substrate by pressure entering a guide pin from an upper part (as an example, see Japanese Laid-open Patent Publication No. 2006-91706).

However, when the module is mounted on the printed circuit board by fitting the connector at the module side with the connector at the printed circuit board side mounted on a surface of the printed circuit board, there are problems described below.

The connector at the module side is provided on the bottom surface of the module. Further, when the connector at the module side is fitted with the connector at the printed circuit board side, a distance between components of each of the connector at the printed circuit board side and the connector at the modules side is small. Accordingly, it is impossible to perform an operation for fitting the connectors together while visually observing.

Further, even when pins of the connector are bent or broken to be a defective good when the connectors are fitted together in the state where the positions of the conneceters are deviated to each other, it is impossible to detect such a defective good in an assembling process. Accordingly, the defective good is to be found in a check process after the assembling process. Then, when the defective good is found by the following check process, it is required that the defective good is fed back to the assembling process and many processes are re-executed again.

Further, since pins of the connector are easily bent or broken to be a defective good due to the aforementioned reason, it is necessary for the operator to carefully execute the operation of fitting the connectors together. This increases the time required for the manufacturing process.

SUMMARY

According to an aspect of the invention, an apparatus includes a case including a surface, a bottom face and a first hole arranged on the bottom face; a first connector on the bottom face of the case; and a guide pin arranged in the first hole and being capable of moving in the first hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a flow chart for illustrating a procedure of each process of a module mounting method according to the embodiment of the invention.

DESCRIPTION OF EMBODIMENTS

Next, the best mode for carrying out the invention will be described with drawings.

Embodiment

First, with reference to FIGS. 2A and 2B, a module mounting structure in the case where a guide pin is provided at a printed circuit board side will be described.

Figure 1A:
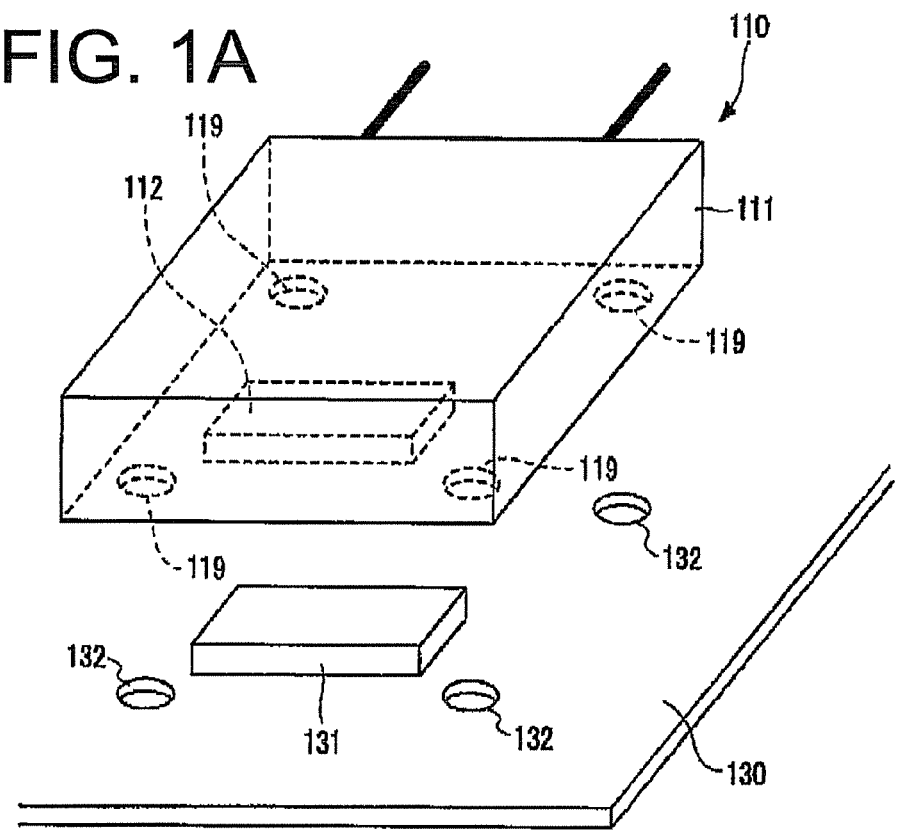
FIGS. 1A and 1B are diagrams illustrating a module mounting structure in which a module is mounted on a printed circuit board by using a conventional SMD connector.
Figure 1B:
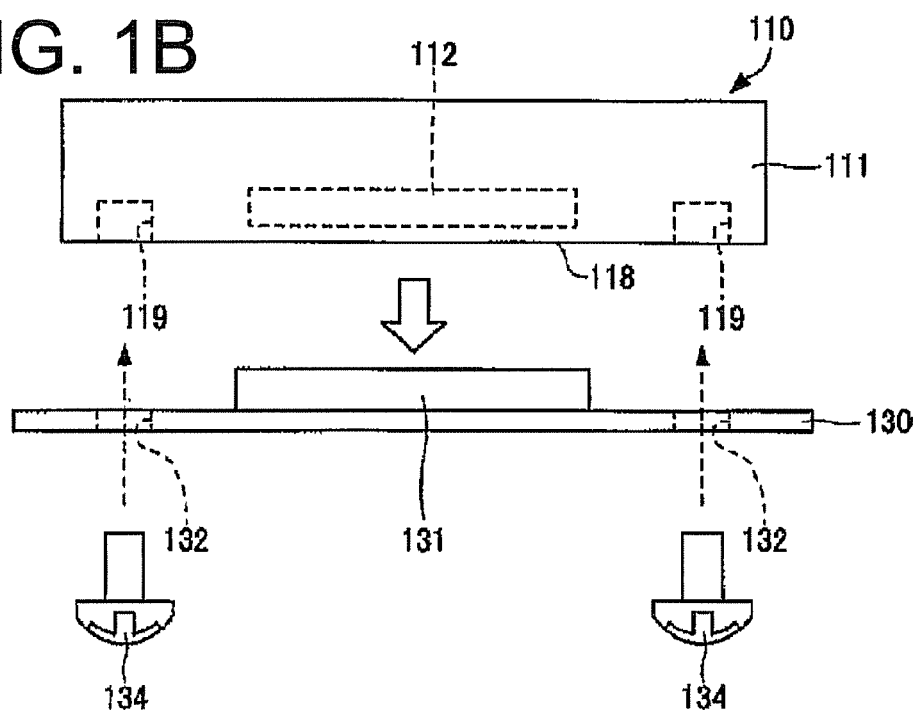
Figure 2A:
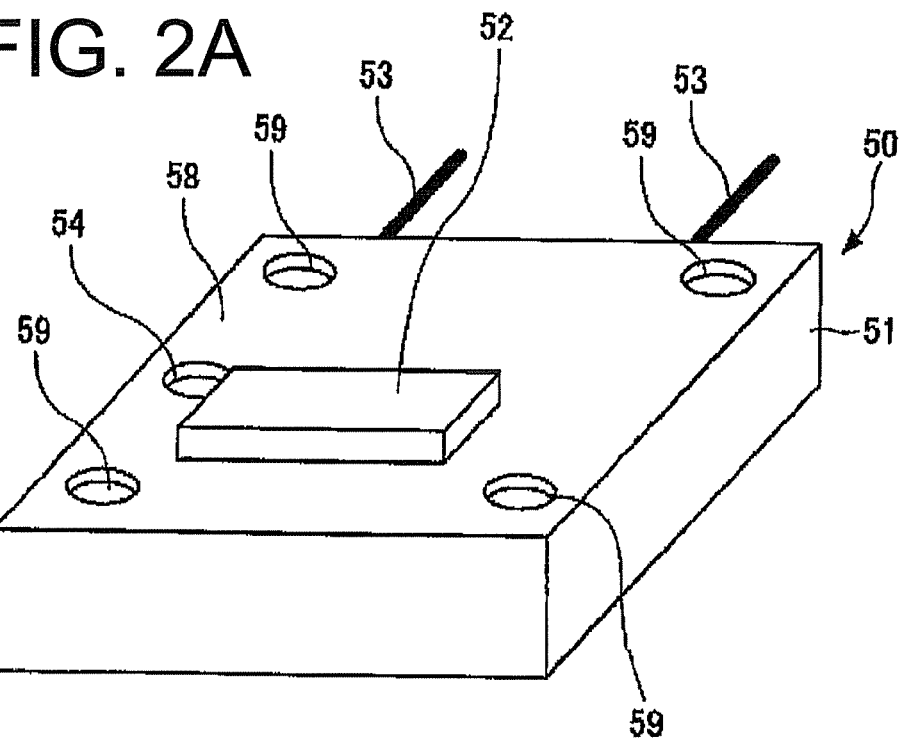
FIGS. 2A and 2B are cross sectional views illustrating a module mounting structure when a guide pin is provided at a printed circuit board side.
Figure 2B:
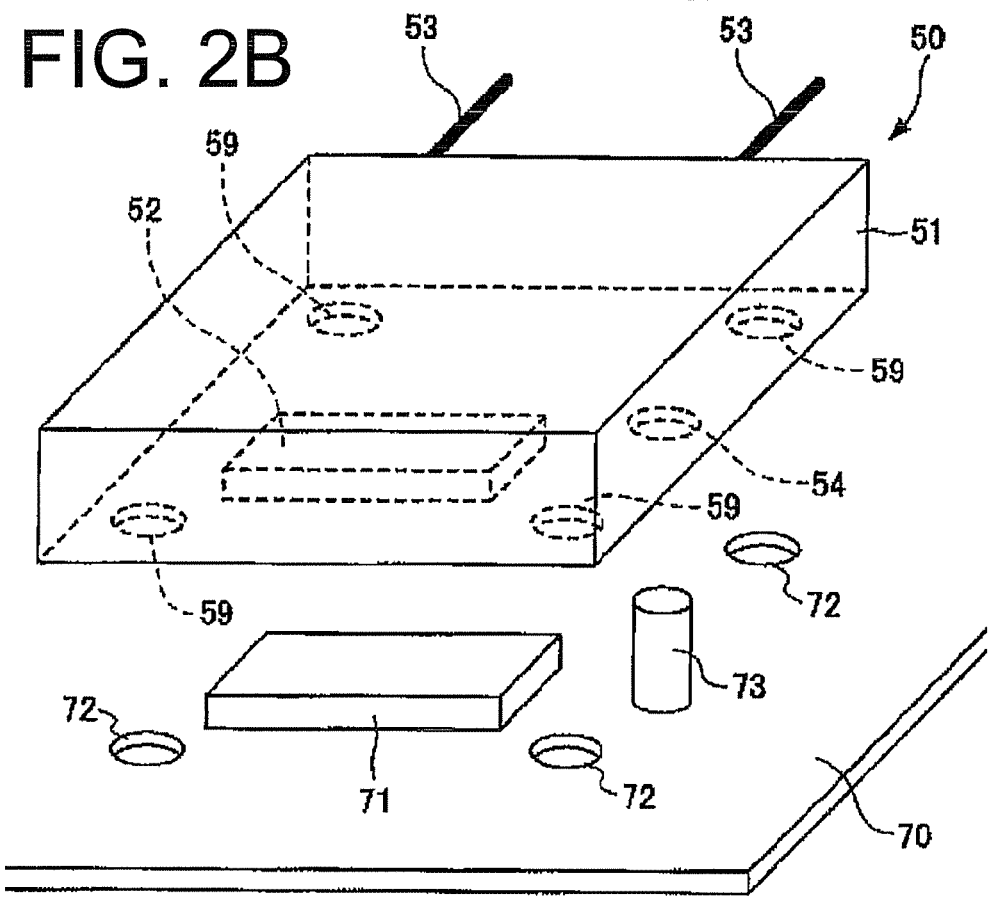

FIGS. 2A and 2B are perspective views illustrating a module mounting structure in the case where a guide pin is provided at a printed circuit board side. FIG. 2 A is a perspective view illustrating the structure of a module in the state where the module is inverted so that the bottom surface is turned upward, and FIG. 2B is an assembly perspective view illustrating the module mounting structure.

In the module mounting structure illustrated in FIG. 2A and FIG. 2B, a module 50 includes a housing 51, a connector 52 at the module side, and cables 53. The connector 52 at the module side is provided so as to be exposed at a bottom surface 58 of the housing 51. On the other hand, a printed circuit board 70 includes a connector 51 at the printed circuit board side and through holes 72 as illustrated in FIG. 2B. The connector 71 at the printed circuit board side is provided on an upper surface of the printed circuit board 70. The connector 71 at the printed circuit board side is provided to correspond to the connector 52 at the module side.

Further, in the module mounting structure illustrated in FIG. 2A and FIG. 2B, a guide pin 73 is provided on an upper surface of the printed circuit board 70, and a receiving hole 54 in which the guide pin 73 is fitted is provided on a bottom surface 58 of the housing 51 of the module 50. Positioning of the module 50 is made by fitting the guide pin 73 provided on the upper surface of the printed circuit board 70 on the receiving hole 54 provided in the bottom surface 58 of the housing 51. Then, the connector 52 provided at the printed circuit board 70 side and the connector 71 at the printed circuit board side are connected to each other.

In the module mounting structure illustrated in FIG. 2A and FIG. 2B, the guide pin 73 is provided to project upward from the upper surface of the printed circuit board 70. Further, the receiving hole 54 of the guide pin 73 is provided on the bottom surface 58 of the housing 51 of the module 50 and at a portion adjacent to the connector 52 at the module side. The depth size of the receiving hole 54 is larger than the height size of the guide pin 73. Further, the cross sectional size of the receiving hoe 54 is larger than the cross sectional size of the guide pin 73. Accordingly, in the state where the guide pin 73 is inserted in the receiving hole 54, the position can be corrected by rotating the module 50 about the guide pin 73 as the center.

After the connector 52 at the module side and the connector 71 at the printed circuit board side are connected, a screw passed through a through hole 72 provided on the printed circuit board 70 from the lower surface of the printed circuit board 70 is screwed into each of a plurality of screw holes 59 provided on the bottom surface 58 of the housing 51 of the module 50. As illustrated in FIG. 2B, the plurality of through holes 72 are provided on the printed circuit board 70. For example, the through holes 72 are provided at four portions to correspond to the screw holes 59 provided at the four corners of the rim of the bottom surface 58 of the housing 51 of the module 50.

In the module mounting structure as illustrated in FIG. 2, it is necessary to provide the guide pin on the printed circuit board. However, another module, a component except the module, or the like is mounted to adjacent to the module on the printed circuit board. Accordingly, there is a risk that there is no space to provide the guide pin on the printed circuit board. Even when there is a space for providing the guide pin, there is a risk that the guide pin is made contact with an adjacent component or the like when providing the guide pin since various components are already mounted. Further, there is a case that the provided guide pin may be an obstacle when, for example, mounting another component or the like.

Consequently, in the embodiment, the guide pin is provided at the module side by using one of screw holes formed at four corners of a bottom surface of a conventional module.

Hereinafter, the module mounting structure according to the embodiment will be described with reference to FIG. 3A to FIG. 5B.

Figure 3A:
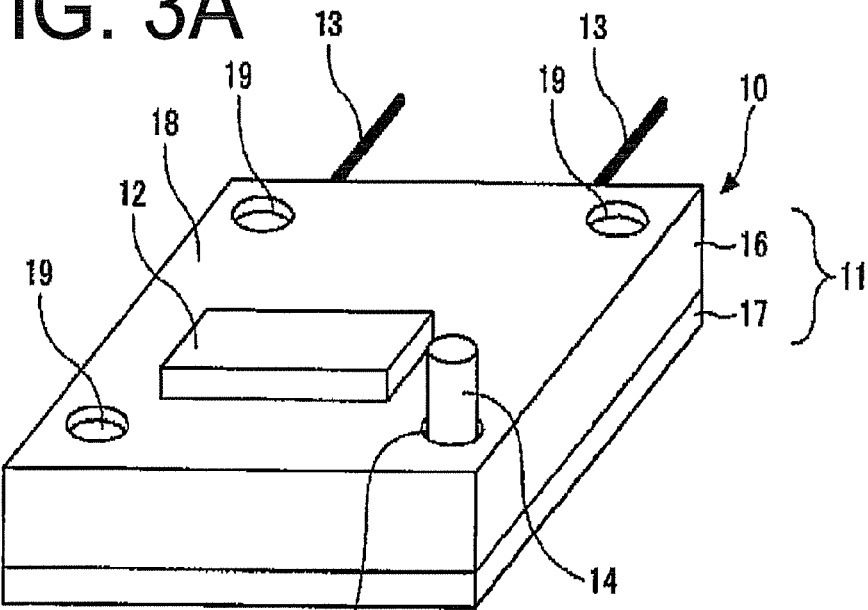
FIGS. 3A and 3B are perspective views illustrating a module and a module mounting structure according to the embodiment of the invention.
Figure 3B:
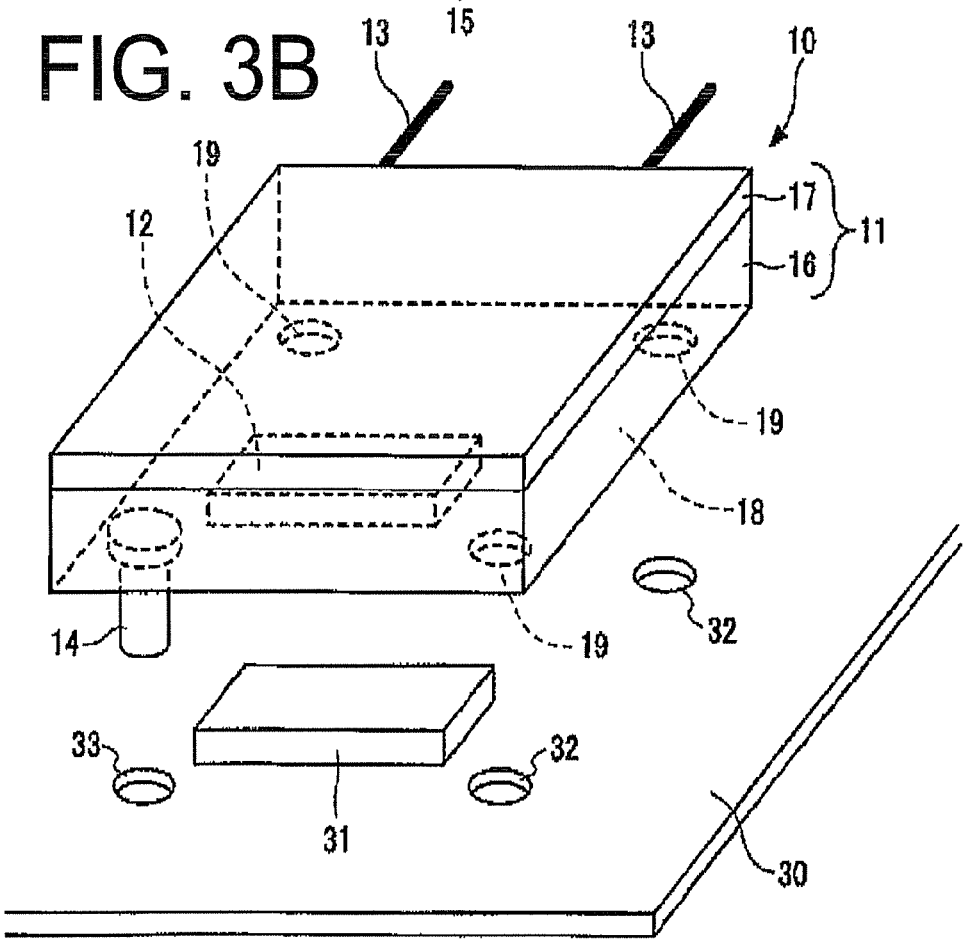
Figure 4A:
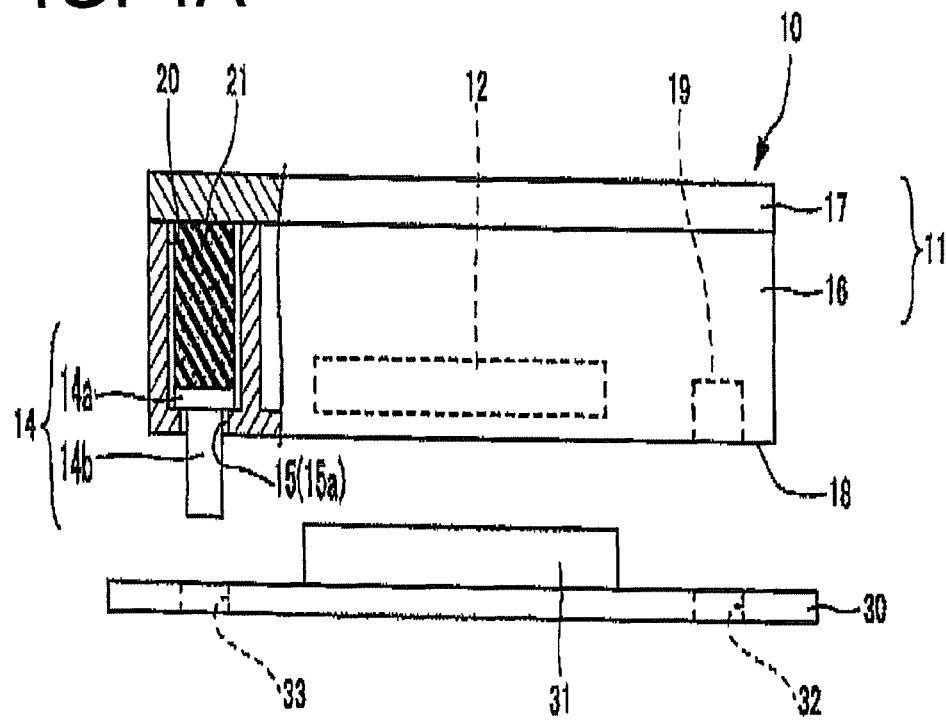
FIGS. 4A and 4B are front views including a partial cross section illustrating the module and the module mounting structure according to the embodiment of the invention.
Figure 4B:
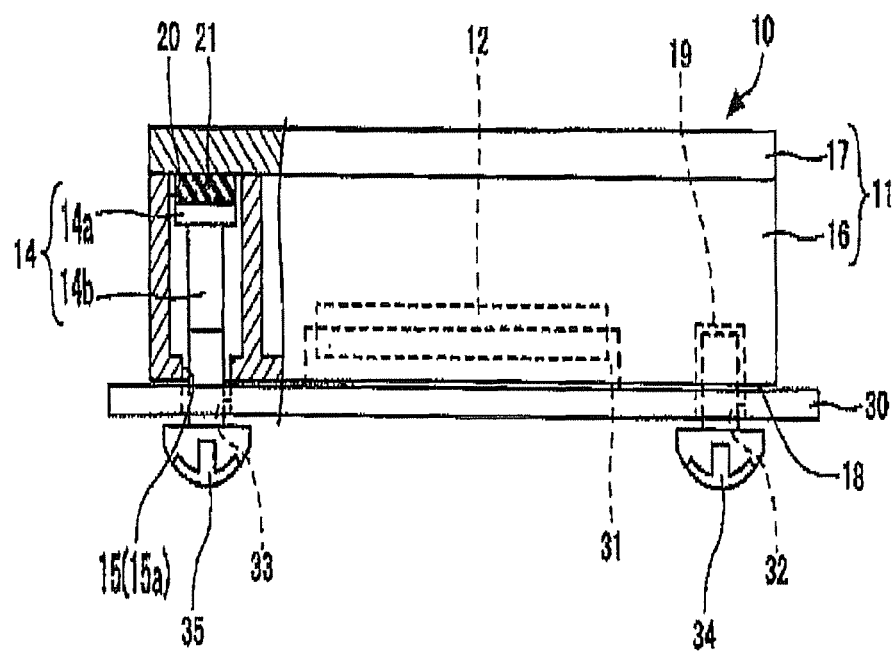
Figure 5A:
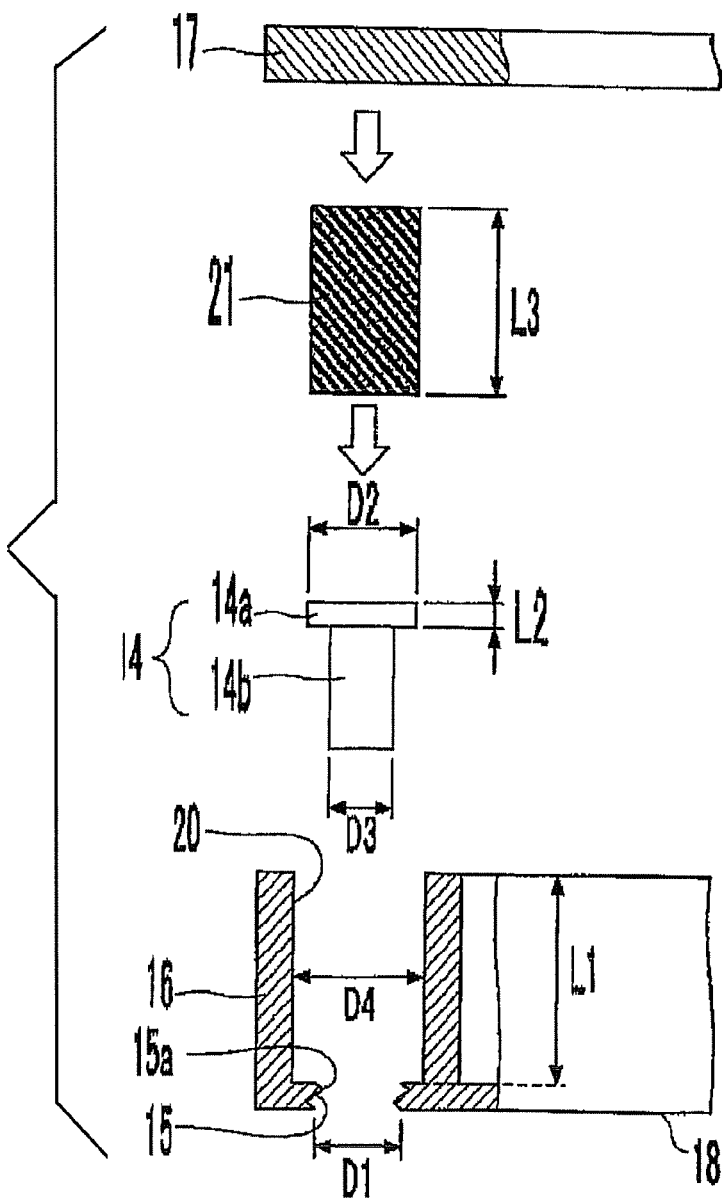
FIG. 5A is a diagram for illustrating the module according to the embodiments.
Figure 5B:
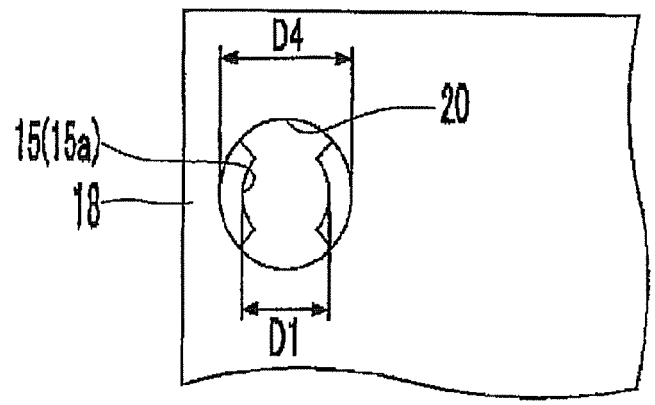
FIG. 5B is an enlarged diagram illustrating the vicinity of a guide pin, a guide pin storage hole, and an opening.

FIGS. 3A and 3B are perspective views illustrating a module and a module mounting structure according to the embodiment. FIG. 3A is a perspective view illustrating the structure of the module in the case where the bottom surface is inverted so that the bottom surface is turned upward, and FIG. 3B is an assembly perspective view illustrating the module mounting structure. FIGS. 4A and 4B are front views including a partial cross section illustrating the module and the module mounting structure according to the embodiment. FIG. 4A illustrates the state before the module is mounted, and FIG. 4B illustrates the state after the module is mounted. FIGS. 5A and 5B are diagrams for illustrating the module according to the embodiment, and are enlarged diagrams illustrating the vicinity of the guide pin, a guide pin storage hole, and an opening. FIG. 5A is a front view including a partial cross section illustrating the structure of the guide pin and the guide pin storage hole, and FIG. 5B is a plan view illustrating the structure of the opening.

With reference to FIGS. 3A and 3B and FIGS. 4A and 4B, the module mounting structure according to the embodiment includes a module 10 and a printed circuit board 30.

The module 10 includes a housing 11, a connector 12 at the module side, cables 13, a guide pin 14, and an opening 15 as shown in FIG. 3A and FIG. 3B. The housing 11 includes a main body 16 and an upper lid 17.

The connector 12 at the module side is provided so as to be exposed at the bottom surface 18 of the housing 11. As described below, the connector 12 at the module side is provided to correspond to the connector 31 at the printed circuit board side and is a connector for electrically connecting the module 10 and the printed circuit board 30. As the connector, an SMD connector having, for example, about 300 pins can be used.

Note that the connector 12 at the module side corresponds to a first connector of the invention. Further, the connector 12 at the module side is not limited to the SMD connector, and another general connector can be used.

The cable 13 is provided to pass through a side surface of the main body 16 of the housing 11 and to extend toward outside of the housing 11 from inside of the housing 11. For example, two cables 13 can be provided as shown in FIG. 3A.

The guide pin 14 is provided to project from the opening 15 provided on the bottom surface 18 of the housing. Further, the guide pin 14 can be moved in the direction to enter the housing 11 from the opening 15 provided on the bottom surface 18 of the housing 11. Further, the opening 15 is provided at the rim of the bottom surface 18 of the housing 11. Accordingly, the guide pin 14 projects from the opening provided on the rim of the bottom surface 18 of the housing 11 and is entered in the housing 11 from the opening 15 provided on the bottom surface 18 of the housing 11. The opening 15 can be provided at one portion among the four portions which are the four corners of the bottom surface 18 of the housing 11. As a result, the guide pin 14 can be also provided at one portion among the four portions which are the four corners of the bottom surface 18 of the housing 11. Note that the guide pin 14 may be provided at not less than two portions among the four portions which are the four corners of the bottom surface 18 of the housing 11.

Further, the guide pin 14 has an engage part 14a and a shaft part 14b as shown in FIG. 4A and FIG. 4B. The engage part 14a has a cross section size D2 larger than a cross section size D1 of the opening 15 as shown in FIG. 5A, and is engaged with the opening 15 to remain inside the housing 11. The shaft part 14b has a cross section size D3 smaller than the cross section size D2 of the engage section 14 and the cross section size D1 of the opening 15. The material of the guide pin 14 may be a metal such as SUS, or may be a resin.

In the embodiment, the housing 11 has screw holes 19 on the bottom surface 18 as shown in FIG. 3A. The screw holes 19 are provided at the rim of the bottom surface 18 of the housing 11. The screw holes 19 can be provided, for example, at the remaining three portions among the four portions which are the four corners of the rim of the bottom surface 18 of the housing 11 except one portion at which the guide pin 14 is provided to project from the opening 15. As described below, the screw hole 19 is provided to screw-clamp the module 10 to the printed circuit board 30.

In the embodiment, the housing 11 includes a storage hole 20 corresponding to a storage part for storing the guide pin of the invention. The storage hole 20 is provided to communicate with the opening 15 as shown in FIG. 4 and FIG. 5. The sealing surface of the storage hole 20 can be the lower surface of the upper lid 17 of the housing 11. The guide pin 14 is stored in the storage hole 20. A cross section size D4 of the storage hole 20 is larger than the cross section size D2 of the engage part 14a of the guide pin 14 as shown in FIGS. 4A and 4B and FIGS. 5A and 5B. Accordingly, the cross section size D4 of the storage hole 20 is larger than the cross section size D1 of the opening 15.

By satisfying the aforementioned relationship of the sizes, the shaft part 14b of the guide pin 14 can be projected from the bottom surface 18 of the housing 11 via the opening 15. Further, the guide pin 14 can be moved in the direction to enter the housing 11 from the bottom surface 18 of the housing 11 via the opening 15. That is, the guide pin 14 has the shaft part 14b at the side projecting from the bottom surface 18 of the housing 11, and has the engage part 14a at the side (entering side in the housing 11) opposite to the side projecting from the bottom surface 18 of the housing 11.

Note that, the storage part for storing the pin of the invention is not limited to the hole. For example, the storage part may be a space for storing a component of the module as described in a first modification of the embodiment.

Further, in the embodiment, a thread 15a is formed on the opening 15. As described below, the thread 15a is provided to screw-clamp the module 10 to the printed circuit board 30. It is necessary for the opening 15 and the thread 15a that a screw is rotated by two or three times in a spiral manner along the direction in which the guide pin 14 is entered in the housing 11 and is screwed. In the case, the thread 15a is formed to have the length of over about 1 mm along the direction in which the guide pin 14 is entered in the housing 11. Further, it is not necessary that the opening 15 and the thread 15a are formed over the whole circumference, and for example, as shown in FIG. 5B, the opening 15 and the thread 15a may be formed so that parts thereof each having size of about ¼ of the whole circumference are arranged to oppose to each other along the diameter direction of the opening cross section of the storage hole 20.

Further, in the embodiment, as shown in FIGS. 4A and 4B and FIGS. 5A and 5B, an elastic member 21 is included in the storage hole 20 and at the side (at the entering side in the housing 11 and at the engage part 14a side) opposite to the side at which the guide pin 14 is projected from the bottom surface 18 of the housing 11.

The elastic member 21 can be elongated and contracted along the direction in which the guide pin 14 is projected from the bottom surface 18 of the housing 11, or the direction in which the guide pin 14 is entered in the housing 11. Herein, as shown in FIG. 5A, assuming that the length size from the upper end of the opening 15 to the sealing surface (for example, the lower surface of the upper lid 17 of the housing 11) of the storage hole 20 is L1, and the length size corresponding to the thickness of the engage part 14a of the guide pin is L2. In this case, assuming that the length size of the elastic member 21 along the shaft direction of the guide pin 14 is L3, the elastic member 21 having the length satisfying L3>L1−L2 is used. That is, the elastic member 21 having the length side L3 longer than the distance L1−L2 between the upper end of the engage part 14a of the guide pine 14 in the case where the guide pin 14 is most projected from the bottom surface 18 of thee housing 11 and the engage part 14a of the guide pin 14 is engaged with the opening 15 and the sealing surface of the storage hole 20 (for example, lower surface of the upper lid 17 of the housing 11). By disposing the elastic member 21 having the length size of L3 (>L2−L1), the guide pin 14 is biased in the direction to project from the bottom surface 18 of the housing 11. As the material of the elastic member 21, for example, a gum, a sponge, a spring such as a coil spring, or the like can be used.

On the other hand, the printed circuit board 30 has a connector 31 at the printed circuit board side, and through holes 32, 33 as shown in FIG. 3B.

The connector 31 at the printed circuit board side is provided on the upper surface of the printed circuit board 30. The connector 31 at the printed circuit board side electrically connects the module 10 and the printed circuit board 30 as described above. An SMD connector can be used as the connector 31, and the connector 31 is provided to correspond to the connector 12 at the module side.

Note that the connector 31 at the printed circuit board side corresponding to a second connecter of the invention. Further, the connector 31 of the printed circuit board side is also not limited to the SMD connector, and another general connector can be used.

The plurality of through holes 32, 33 are provided on the printed circuit board 30 as shown in FIG. 3B. The through hole 32 is a hole provided by penetrating the printed circuit board 30 in order to screw-clamp the module 10 to the printed circuit board 30 by using the screw hole 19 of the module 10. The through hole 33 is a hole provided by penetrating the printed circuit board 30 in order to screw-clamp the module 10 to the printed circuit board 30 by using the thread 15a provided on the opening 15 of the module 10. The through hole 32 is provided at a position corresponding to the screw hole 19. Specifically, the through hole 32 is provided at, for example, three portions to correspond to the screw holes 19 provided at three portions among the four portions of the four corners of the rim of the bottom surface 18 of the housing 11 of the module 10. On the other hand, the through hole 33 is provided at a position corresponding to the opening 15. Specifically, the through hole 33 is provided at, for example, one portion at which the through hole 32 is not provided among the four portions of the four corners of the rim of the bottom surface 18 of the housing 11 of the module 10 to correspond to the opening 15.

As shown in FIG. 4B, the module 10 is screw-clamped to the printed circuit board 30 by using the plurality of screw holes 19 and the thread 15a provided on the opening 15 in the state where the connector 12 at the module side and the connector 31 at the printed circuit board side are connected to each other.

In the embodiment, a screw 34 passed through the through hole 32 from the lower surface of the printed circuit board 30 is screwed into each of the plurality of screw holes 19 of the bottom surface 18 of the module 10 in the state where the connector 12 at the module side is connected with the connector 31 at the printed circuit board side. Further, a screw 35 passed through the through hole 33 from the lower surface of the printed circuit board 30 is screwed into the thread 15a of the opening 15 communicated with the storage hole 20.

When compared with FIG. 4A illustrating the state before the module 10 is mounted on the printed circuit board 30, the guide pin 14 is moved in the direction to enter the housing 11 from the opening 15 and the entire guide pin 14 is stored in the storage hole 20 as shown in FIG. 4B. The guide pin 14 is biased by the elastic member 21 from the upper side (engage part 14a side), and is stored in the storage hole 20 in the state where the lower side (shaft part 14b side) is made contact with a shaft part of the screw 35.

Note that a thread provided on the screw hole 19 and the thread 15a provided on the opening 15 may have the same shape. In this case, the screw hole 19 and the opening 15 may be screwed by using the screws 34, 35 having the same shape.

Next, with reference to FIG. 6 to FIG. 9B, a module mounting method of the module mounting structure according to the embodiment will be described.

Figure 7A:
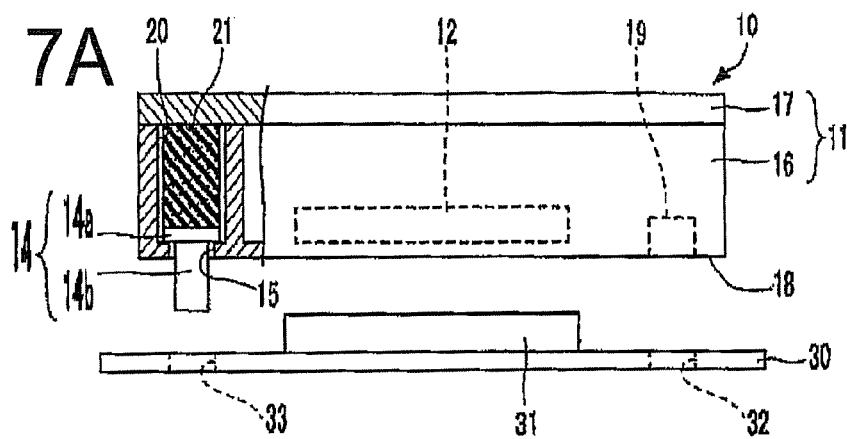
FIGS. 7A to 7D are diagrams for illustrating the module mounting method according to the embodiments.
Figure 7B:
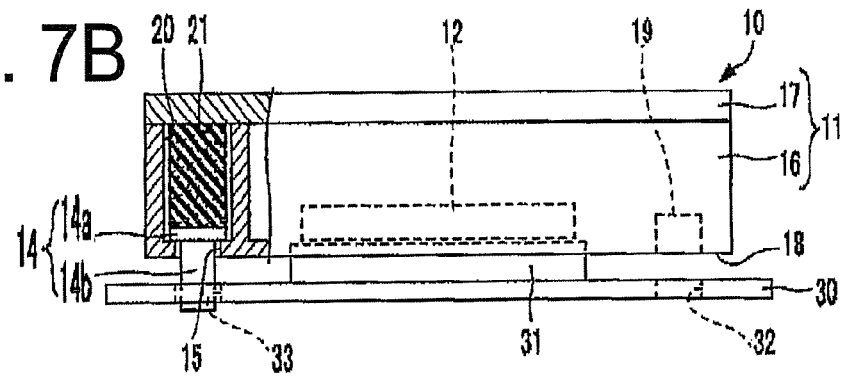
Figure 7C:
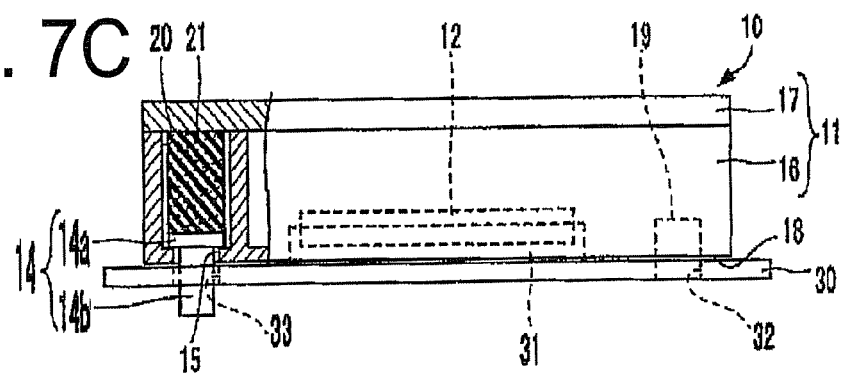
Figure 7D:
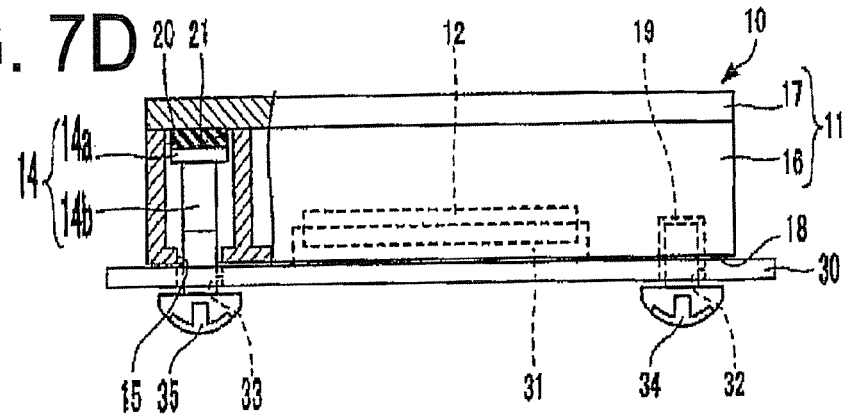
Figure 8:
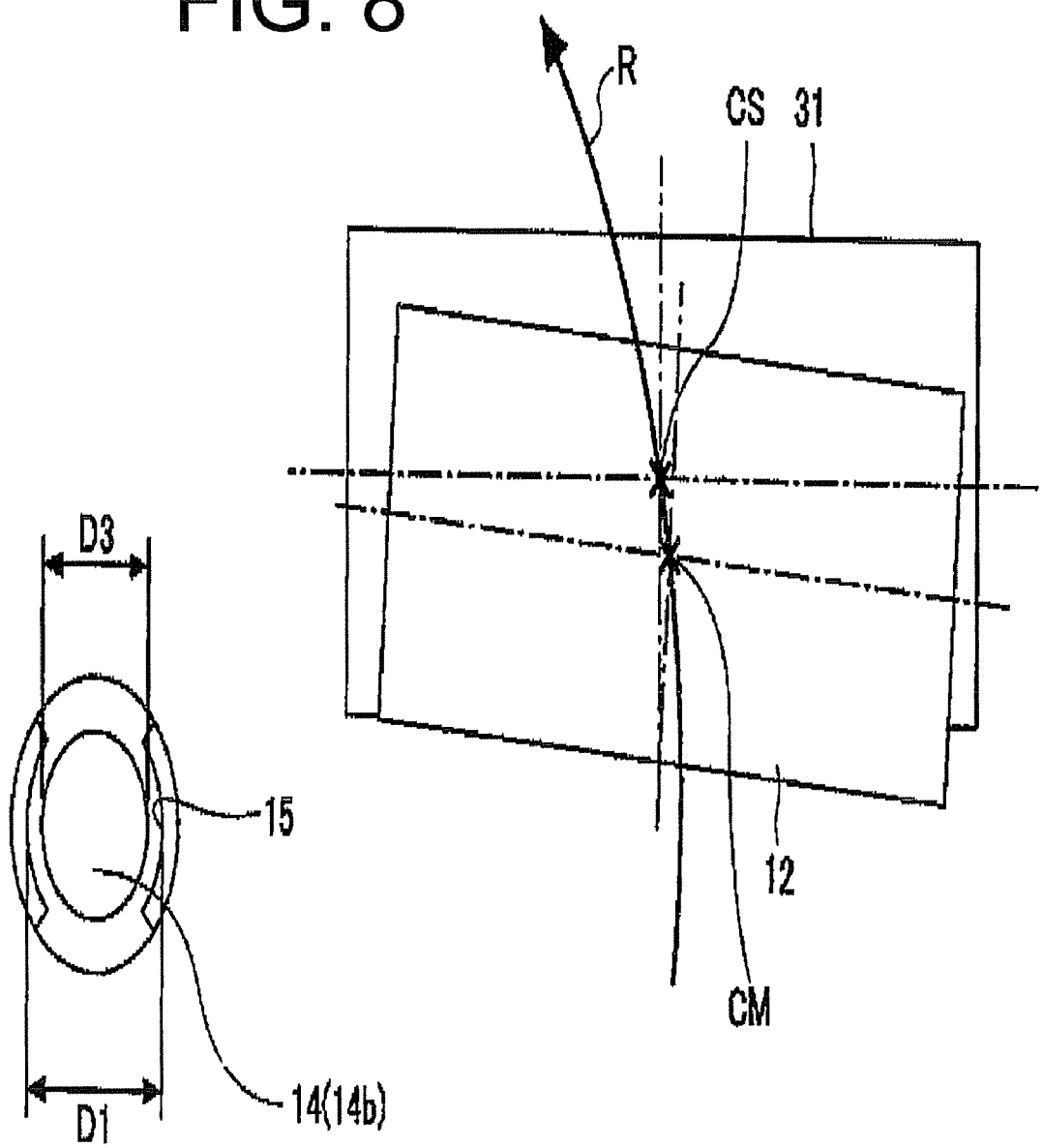
FIG. 8 is diagram for illustrating the module mounting structure according to the embodiment of the invention, and is a plan view illustrating a method of correcting the position of the module so that a first connector at the module side and a second connector at the printed circuit board side are fitted.
Figure 9A:
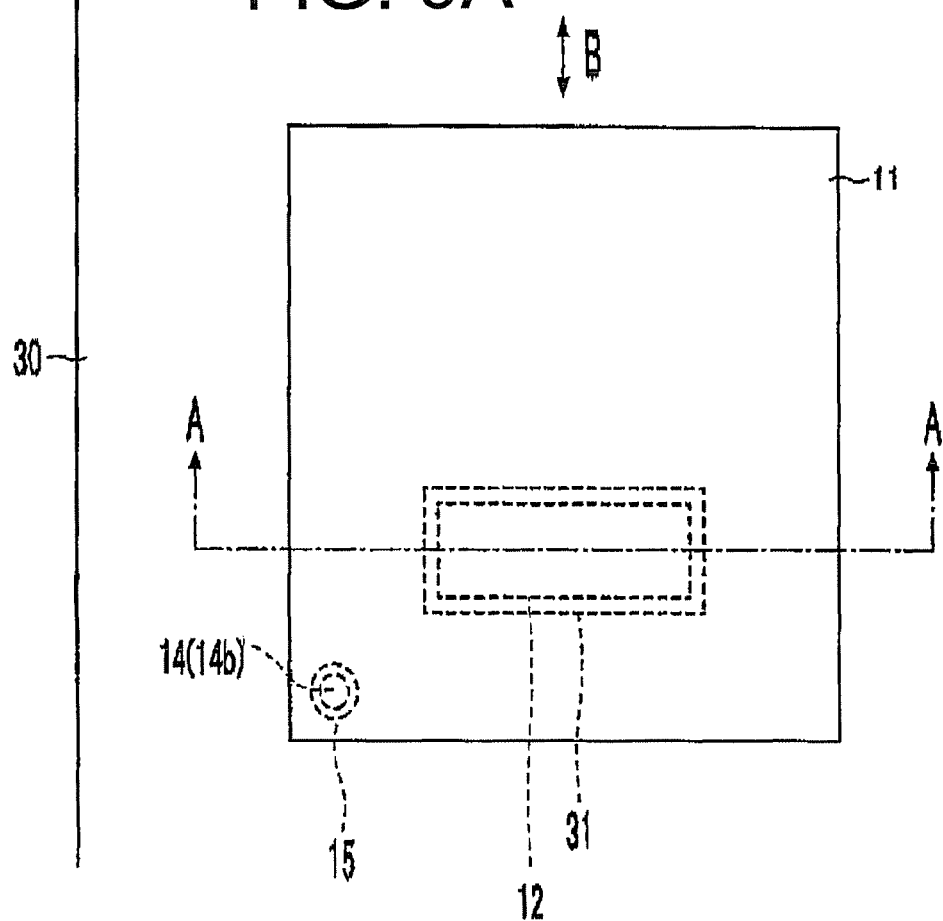
FIG. 9A is a diagram for illustrating the module mounting structure according to the embodiments
Figure 9B:
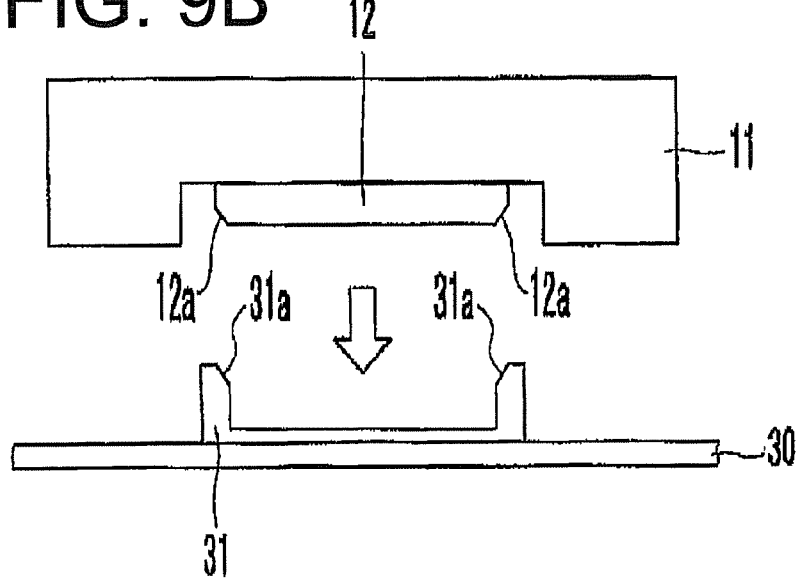
FIG. 9B is a diagram for illustrating the method of correcting the position of the module so that the first connector at the module side and the second connector at the printed circuit board side are fitted.

FIG. 6 is a flow chart illustrating a procedure of each process of the module mounting method according to the embodiment. FIGS. 7A-7D are diagrams for illustrating the module mounting method according to the embodiment, and is a front view illustrating the state of the module and the printed circuit board in each process by using a partial cross section. FIG. 8 is a diagram illustrating the module mounting structure according to the embodiment, and is a plan view illustrating a method of correcting the position of the module so that the first connector at the module side and the second connector at the printed circuit board side are fitted. FIGS. 9A and 9B are diagrams for illustrating the module mounting structure according to the embodiment, and is a diagram illustrating the method of correcting the position of the module so that the first connector at the module side and the second connector at the printed circuit board side are fitted. FIG. 9A is a plan view illustrating the positional relationship between the module and the printed circuit board, and FIG. 9B is a cross sectional view taken along the line A-A of FIG. 9A.

The module mounting method according to the embodiment includes step S11 to step S14 as shown in FIG. 6.

First, step S11 is performed. Step S11 is a step of inserting the guide pin 14 in the through hole 33. FIG. 7A is a diagram illustrating the state of the module 10 and the printed circuit board 30 before step S11 is performed. FIG. 7B is a diagram illustrating the state of the module 10 and the printed circuit board 30 after step S11 is performed.

In the state where the guide pin 14 is projected from the bottom surface 18 of the of the housing 11 of the module 10, the module 10 is moved toward the printed circuit board 30 from the upper direction, and the guide pin 14 is inserted in the through hole 33 of the printed circuit board 30. At the time, the module 10 and the printed circuit board 30 are preliminarily set at positions which are close to the positions in plan view at which the connector 12 at the module side and the connector 31 at the printed circuit board side are fitted.

Next, step S12 is performed. Step S12 is a step for correcting the position of the module 10 so that the connector 12 at the module side is engaged with the connector 31 at the printed circuit board side in the state where the guide pin 14 is inserted in the through hole 33. FIG. 8 is a diagram illustrating the state in which the center of the connector 12 at the module side is moved about the guide pin 14 as the center when step S12 is performed.

The module 10 is rotated on the printed circuit board 30 about the guide pin 14 as the center to correct the position. By the correction of the position, the center CM of the connector 12 at the module side is moved on the circle R shown in FIG. 8. The position of the guide pin 14 is set so that each side of the connector 12 at the module side is set parallel to each side of the connector 31 at the printed circuit board side when the center CM of the connector 12 at the module side is coincident with the center CS of the connector 31 at the printed circuit board side. Accordingly, by moving the module 10 so that the center CM of the connector 12 at the module side is coincident with the center CS of the connector 31 at the printed circuit board side, the connector 12 at the module side can be corrected to the position to be fitted with the connector 31 at the printed circuit board side.

However, by a small size tolerance or like between manufacturing, even when the center CM of the connector 12 at the module side is coincident with the center CS of the connector 31 at the printed circuit board side, there is a case that there is still a small positional deviation. In this case, it is difficult that the connector 12 at the module side is fitted with the connector 31 of the printed circuit board side. In this case, as shown in FIG. 9A, by slightly moving the module 10 in parallel to the printed circuit board 30 (both directions of B of FIG. 9A), the position can be corrected so that the connector 12 at the module side is fitted with the connector 31 at the printed circuit board side. In the case where the module 10, the printed circuit board 30, and the connectors 12, 31 have rectangular shapes, and the connector 12, 31 are provided in parallel to each side of the module 10 and printed circuit board 30, the position can be easily corrected at the appropriate position. Accordingly, the cross section size D3 of the shaft part 14b of the guide pin 14, the cross section D1 of the opening 15, and the cross section 15 of the through hole 33 of the printed circuit board 30 corresponding to the guide pin 14 may be designed to have a small allowance (size tolerance) so that positional relationship can be corrected to each other.

Next, step S13 is performed. Step S13 is a process of fitting the connector 12 at the module side with the connector 31 at the printed circuit board side by pushing the module 10 to the printed circuit board 30. FIG. 7C is a diagram illustrating the state of the module 10 and the printed circuit board 30 after the process of step S13 is performed.

By performing step S13, the connector 12 at the module side is fitted with the connector 31 at the printed circuit board side. Further, as shown in FIG. 9B, the connector 12 at the module side may have a convex shape, and the connector 31 at the module side may have a concave shape. In this case, as shown in FIG. 9B, a corner of the distal end of the convex of the connector 12 at the module side and a corner of the distal en of the concave of the connector 31 at the printed circuit board side may be surfaced to provide tapers 12a, 31a. By providing the tapers 12a, 31a, correction of the positions of the connector 12 at the module side and the connector 31 at the printed circuit board side becomes easier. Further, it becomes possible to prevent that pins of the connectors 12, 31 are bent or broken.

Finally, step S14 is performed. Step S14 is a process for screw clamping the module 10 to the printed circuit board 30 by using the plurality of screw holes 19 and the thread 15a provided on and the opening 15. FIG. 7D is a diagram illustrating the state of the module 10 and the printed circuit board 30 after the process of step S14 is performed.

As described above, the screw 34 passed through the through hole 32 from the lower surface of the printed circuit board 30 is screwed into each of the plurality of screw holes 19 of the bottom surface 18 of the housing 11 of the module 10. Further, the screw 35 passed through the through hole 33 from the lower surface of the printed circuit board 30 is screwed into the thread 15a of the opening 15 communicating with the storage hole 20. As a result, the module 10 is electrically connected with the printed circuit board 30 by using the connectors 12, 31, and is fixed to the printed circuit board 30 by using the screws 34, 35.

By using such a module mounting structure, it is found that the time required for the process for mounting the module on the printed circuit board can be shortened. When using a conventional module mounting structure, it takes about one minute for the mounting operation. On the other hand, by actually using the module mounting structure according to the embodiment, it is found that it takes about five seconds to finish the mounting operation.

Further, according to the module mounting structure according to the embodiment, after the module is mounted, the guide pin is stored in the housing of the module. Consequently, the through hole, the shape of the screw of the conventional printed circuit board can be used without change.

As described above, according to the module mounting structure according to the embodiment, a positional correction is executed in the state where the guide pin projected from the bottom surface of the module is inserted in the through hole of the printed circuit board. Accordingly, the position of the module with respect to the printed circuit board can be easily determined, and it can be prevented that pins of the connector are bent or broken. Further, the time required for the process of mounting the module can be shorten.

Note that the type of the module according to the embodiment is not specifically limited, and various modules or the like such as an optical amp module and the like are exemplified.

First Modification of the Embodiment

Next, with reference to FIGS. 10A and 10B and FIGS. 11A and 11B, a module and a module mounting structure according to a first modification of the embodiment will be described.

Figure 10A:
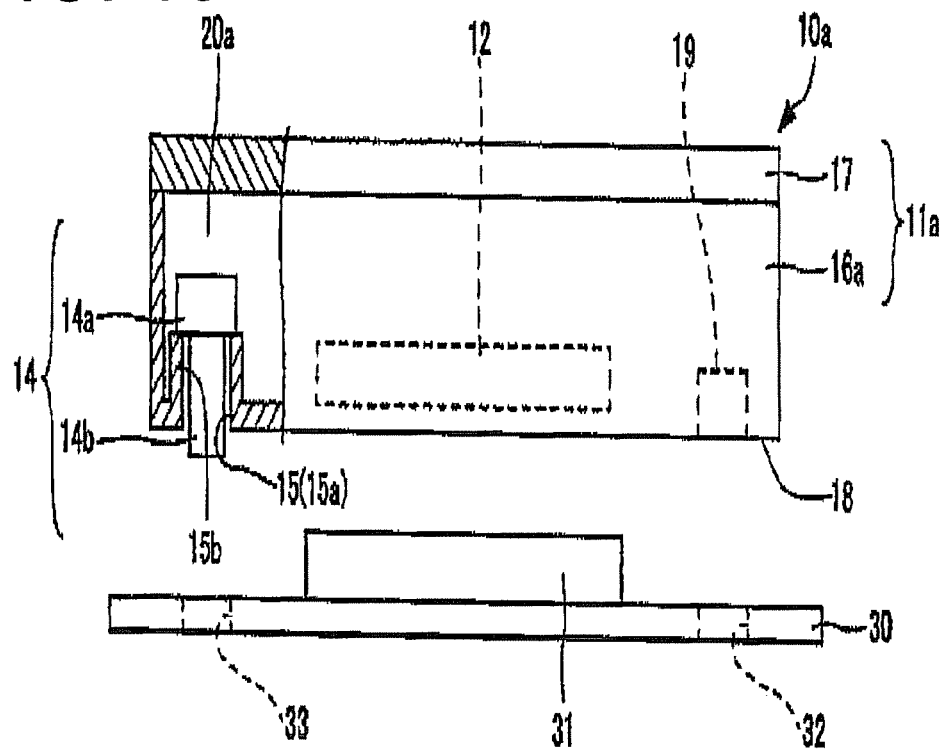
FIGS. 10A and 10B are front views including a partial cross section illustrating a module and a module mounting structure according to a first modification of the embodiment of the invention.
Figure 10B:
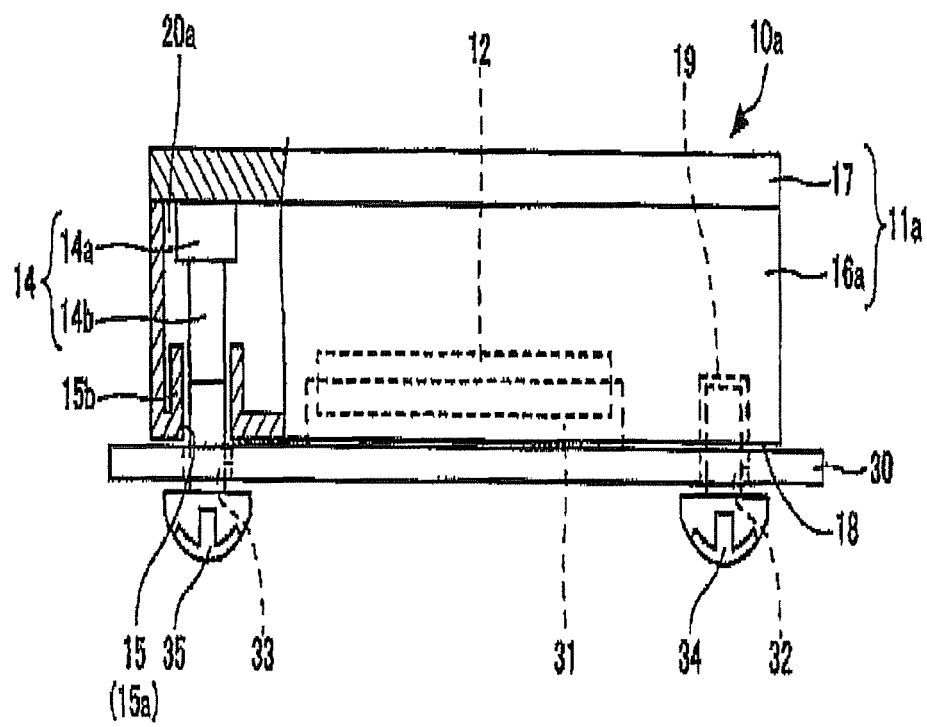
Figure 11A:
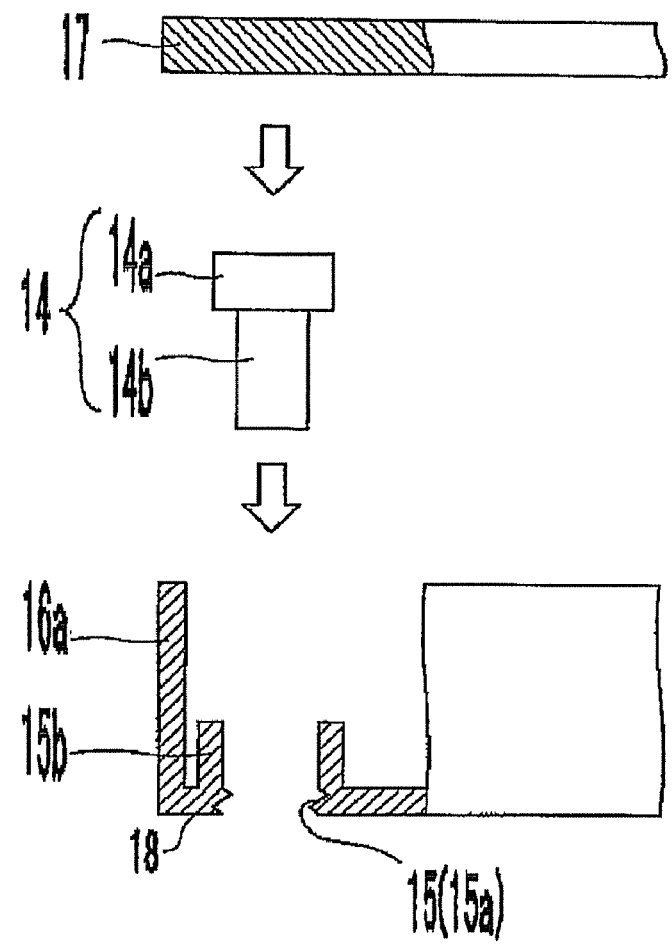
FIGS. 11A and 11B are diagrams for illustrating the module according to the first modification of the embodiment of the invention, and are enlarged diagrams illustrating the vicinity of a guide pin, a guide pin storage hole, and an opening.
Figure 11B:
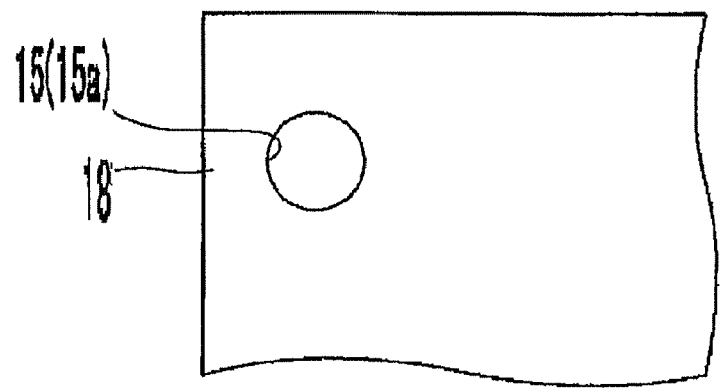

FIGS. 10A and 10B are front views including a partial cross section illustrating a module and a module mounting structure according to the modification. FIG. 10A illustrates a state before the module is mounted, and FIG. 10B illustrates a state after the module is mounted. FIGS. 11A and 11B are diagrams for illustrating the module according to the modification, and are enlarged diagrams illustrating the vicinity of the guide pin, the guide pin storage hole, and the opening. FIG. 11A is a front view including a partial cross section illustrating the structure of the guide pin and guide pin storage hole. FIG. 11B is a plan view illustrating the structure of the opening. Note that in the following sentence, the same reference numeral is used to denote the part described above, and the description thereof may be omitted (similarly to a modification described below).

The module mounting structure of the module according to the modification is different from that of the embodiment at the point that the module does not have the elastic member and the storage hole.

With reference to FIGS. 10A and 10B, similarly to the embodiment, a module 10a according to the modification includes a housing 11a, a connector 12 at the module side, a cable, a guide pin 14, and an opening 15. Further, similarly to the embodiment, the housing 11a includes a main body 16a and an upper lid 17. Further, similarly to the embodiment, the connector 12 at the module side is provided so as to be exposed at a bottom surface 18 of a housing 11a. Further, similarly to the embodiment, the guide pin 14 includes an engage part 14a and a shaft part 14b, and the guide pin 14 is projected from the opening 15 provided at the rim of the bottom surface 18 of the housing 11a. Further, similarly to the embodiment, the guide pin 14 is entered in the housing 11a from the opening 15 provided at the bottom surface 18 of the housing 11a. Further, similarly to the embodiment, the opening 15 is provided at one portion among the four portions which are the four corners of the bottom surface 18 of the housing 11a, and screw holes 19 are provided at the remaining three portions.

On the other hand, in the modification, the module 10a does not have a storage hole. With reference to FIG. 10A, the housing 11a includes only the opening 15a at the bottom surface 18, and has a structure in which the opening 15 is communicated with a space 20a in the housing. Consequently, the module 10a does not have a storage hole provided in order to store the guide pin 14. Note that, as shown in FIG. 10A, the module 10a may have the structure similar to the storage hole by providing a guide part 15b, another partition, or the like so that the guide pin 14 is not toppled to the vicinity where the space 20a in the housing is communicate with the opening 15.

That is, the modification corresponds to the case where the storage part of the invention is not a hole.

Further, in the modification, the module 10 does not have an elastic member. With reference to FIGS. 10A and 10B and FIGS. 11A and 11B, the module 10a does not have an elastic member in the space 20a of the housing and at the side opposite to the side at which the guide pin 14 is projected from the bottom surface 18 of the housing 11a. Consequently, the guide pin 14 is not biased in the direction to project from the bottom surface 18 of the housing 11a. Even when the guide pin 14 is not biased in the direction to project from the bottom surface 18 of the housing 11a, when the module 10a is mounted on the upper surface of the printed circuit board 30, with the bottom surface 18 of the housing 11a pointed downward, the guide pin 14 is projected from the opening 15 by the self weight. Accordingly, it is possible to insert the guide pin 14 in the through hole 33 provided on the upper surface of the substrate 30 to correspond to the position of the guide pin 14.

Then, as shown in FIG. 10B, similarly to the embodiment, the module 10a is screw-clamped to the printed circuit board 30 by using the screw hole 19 of the bottom surface 18 of the housing 11a of the module 10a and the thread 15a of the opening 15.

As described above, according to the module mounting structure according to the modification, it is necessary only to provide the opening on the bottom of the main body of the housing, and it is not necessary to provide a storage hole in the housing, and it is not necessary to use an elastic member. Accordingly, a module having any structure can be used, and it becomes possible to lower the manufacturing cost.

Note that, the type of the module according to the modification is not specifically limited, and various modules or the like such as an optical amp module and the like are exemplified.

Second Modification of the Embodiment

Next, with reference to FIGS. 12A and 12B, a module and a module mounting structure according to a second modification of the embodiment will be described.

Figure 12A:
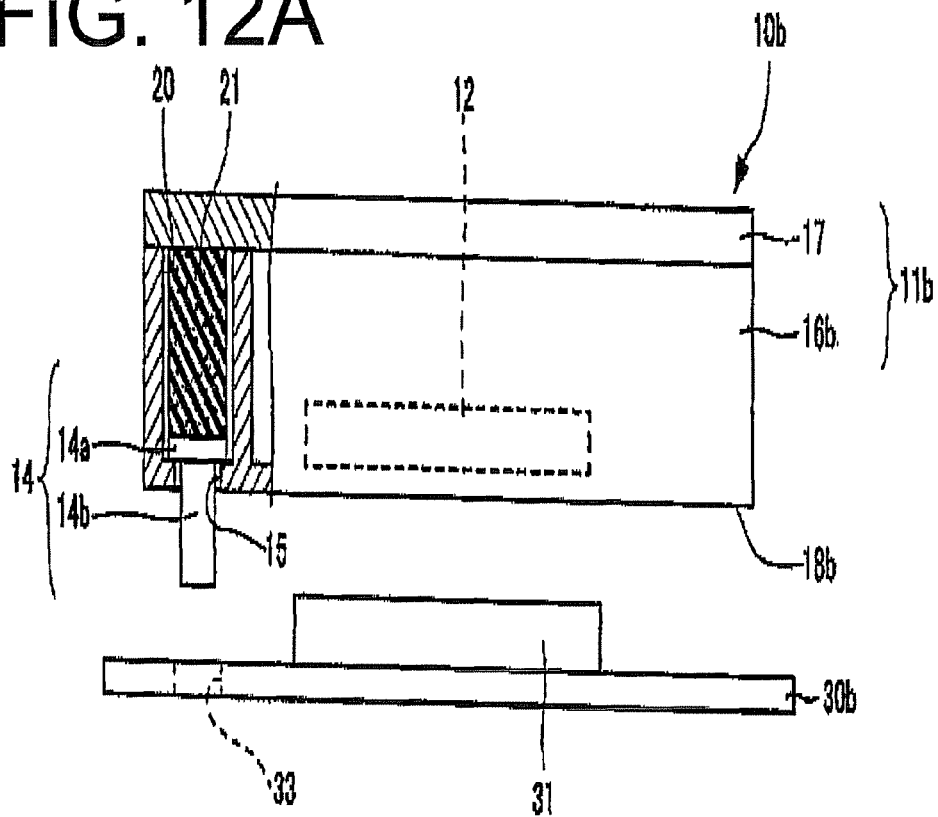
FIGS. 12A and 12B are front views including a partial cross section illustrating a module and a module mounting structure according to a second modification of the embodiment of the invention.
Figure 12B:
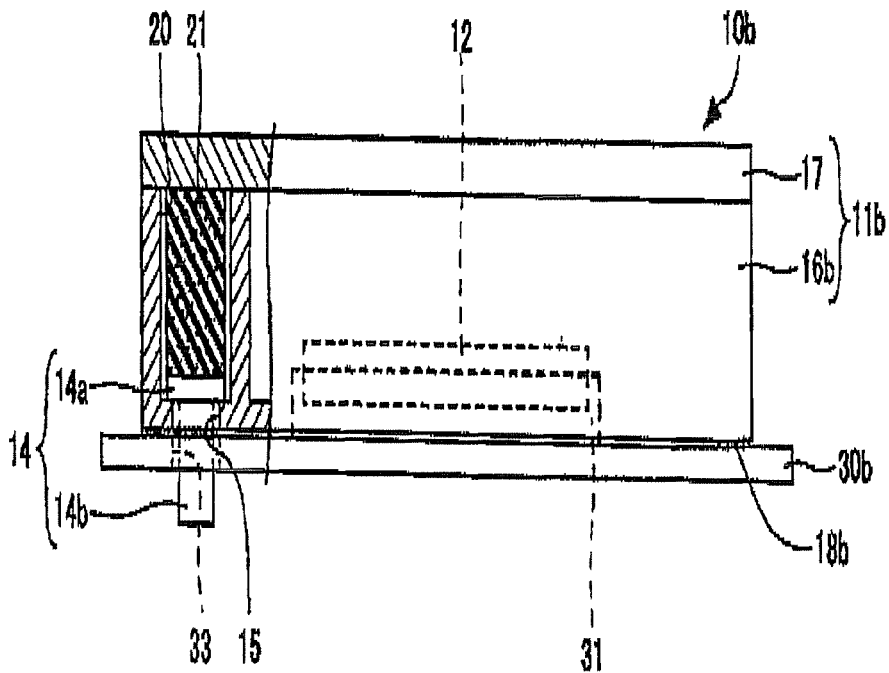

FIGS. 12A and 12B are front views including a partial cross section illustrating a module and a module mounting structure according to the modification.
FIG. 12A illustrates a state before the module is mounted, and FIG. 12B illustrates a state after the module is mounted.

The module mounting structure of the modification is different from that of the embodiment at the point that the module does not have a screw hole and a thread of the opening.

With reference to FIGS. 12A and 12B, similarly to the embodiment, a module 10b according to the modification includes a housing 11b, a connector 12 at the module side, a cable, a guide pin 14, and an opening 15. Further, similarly to the embodiment, the housing 10b includes a main body 16b and an upper lid 17. Further, similarly to the embodiment, the connector 12 at the module side is provided to be exposed at the bottom surface 18b of the housing 11b. Further, similarly to the embodiment, the guide pin 14 includes an engage section 14a and a shaft section 14b, and is projected from the opening 15 provided at the rim of the bottom surface 18b of the housing 11b. Further, similarly to the embodiment, the guide pin 14 is entered in the housing 11b from the opening 15 provided on the bottom surface 18b of the housing 11b.

Further, similarly to the embodiment, the module 10b according to the modification includes a storage hole 20 in the housing 11b. Further, similarly to the embodiment, the module 10b includes an elastic member 21 in the storage hole 20 and at the side (at the side to which the guide pin 14 is entered in the housing 11b, and the at the engage part 14a side) opposite to the side at which the guide pin 14 is projected from the bottom surface 18b of the housing 11b.

On the other hand, the module 10b according to the modification has no screw hole on the bottom surface 18b of the housing 11b. Accordingly, the module 10b according to the modification is different from the module 10 according to the embodiment in which a screw hole is provided at each of three portions among the four portions which are the four corners of the bottom surface 18 of the housing 11. Further, a thread is not formed on the opening 15 in the module 10b according to the modification.

Accordingly, the through hole corresponding to the through hole 32 provided on the printed circuit board 30 to correspond to the screw hole 19 illustrated in FIG. 3 of the embodiment is not provided in the modification. The through hole provided on the printed circuit board 30b is only the through hole 33 provided to correspond to the opening 15.

Similarly to the embodiment, the guide pin 14 is biased by the elastic member 21 and is projected from the opening 15 when the module 10b according to the modification is mounted on the upper surface of the printed circuit board 30b, with the bottom surface 18b pointed downward. Accordingly, as illustrated in FIG. 12A, it is possible to insert the guide pin 14 in the through hole 33 provided on the upper surface of the printed circuit board 30b to correspond to the position of the guide pin 14.

After the position of the module 10b is corrected in the state where the guide pin 14 is inserted, as illustrated in FIG. 12B, the connector 12 at the module side is fitted with the connector 31 at the printed circuit board side. In this manner, the module 10b can be mounted on the printed circuit board 30b.

In the modification, the module 10b does not have a screw hole on the bottom surface 18b of the housing 11b, and does not have a thread on the opening 15 of the bottom surface 18b of the housing 11b, so that the module 10b is not screw-clamped to the printed circuit board 30b. However, the module 10b is electrically connected with the printed circuit board 30b and is engaged with the printed circuit board 30b by using the connectors 12, 31. Further, the module 10b restrains the module 10b with respect to the movement along the horizontal direction on the printed circuit board 30b by using thee guide pin 14 biased by the elastic member 21. Accordingly, the module 10b is fixed on the printed circuit board 30b.

As described above, according to the module mounting structure according to the modification, even when a screw hole or the like is not provided on the bottom surface of the housing, the module can be fixed to the printed circuit board. Accordingly, the number of components such as a screw and the like can be reduced, and a step for screw clamping can be eliminated, and it becomes possible to reduce the manufacturing cost.

Note that, the type of the module according to the modification is not specifically limited, and various modules or the like such as an optical amp module and the like are exemplified.

The preferable embodiment of the invention is described above. However, the invention is not limited to the specific embodiment, and various changes and modifications can be made without departing from the scope of the gist of the invention described in the scope of claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An apparatus comprising:
    a case including a surface, a bottom face and a first hole arranged on the bottom face;
    a first connector on the bottom face of the case; and
    a guide pin arranged in the first hole and being capable of moving in the first hole,
    wherein a thread is formed in the first hole for clamping a screw along a direction in which the guide pin enters the case.

2. The apparatus of claim 1, further comprising an elastic member being arranged in the first hole;
    wherein the guide pin is biased for projecting from the bottom face of the case by the elastic member.

3. The apparatus of claim 1, wherein the first connector is a surface mount device connector.

4. The apparatus of claim 1, further comprising a printed circuit board including a second hole arranged on the opposite side of the first hole; and a second connector arranged on the printed circuit board, the second connector being able to connect with the first connector of the case.

5. The apparatus of claim 4, further comprising an elastic member being arranged in the hole;
    wherein the guide pin is biased for projecting from the bottom face of the case by the elastic member.

6. The apparatus of claim 4, wherein the first connector is a surface mount device connector.

7. An apparatus comprising:
    a case including a surface, a bottom face and a first hole arranged on the bottom face;
    a first connector on the bottom face of the case;
    a printed circuit board including a second hole;
    a second connector arranged on the printed circuit board, the second connector being able to connect with the first connector of the case; and
    a guide pin capable of moving in the first and second holes, wherein a thread is formed in the first hole for clamping a screw screwed along a direction in which the guide pin enters the case and from a side of the printed circuit board opposite the case.

8. An apparatus comprising:
    a case including a bottom face and a threaded first hole arranged in the bottom face;
    a first connector on the bottom face of the case;
    a printed circuit board including a second hole;
    a second connector arranged on the printed circuit board and being connectable with the first connector; and
    a guide pin for guiding clamping of the case and the printed circuit board together, the guide pin capable of moving through the first hole in a first direction to thereby enter the case, and capable of moving through the second hole in a second direction opposite the first direction; and
    a screw screwed in threads of the first hole along the first direction and from a side of the printed circuit board opposite the case, to thereby screw-clamp the printed circuit board and the case together.

* * * * *